United States Patent
Reynoso Galvan et al.

(10) Patent No.: US 10,028,391 B1
(45) Date of Patent: Jul. 17, 2018

(54) BUSSED ELECTRICAL CENTER

(71) Applicant: Delphi Technologies, Inc., Troy, MI (US)

(72) Inventors: Naiki A. Reynoso Galvan, Chihuahua (MX); Rodrigo Villanueva Ponce, Chihuahua (MX); Irving Meza Ricano, Chihuahua (MX)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 15/653,609

(22) Filed: Jul. 19, 2017

(51) Int. Cl.
*H01R 13/627* (2006.01)
*H05K 3/32* (2006.01)
*B60R 16/023* (2006.01)
*H01R 13/502* (2006.01)
*H01R 13/621* (2006.01)

(52) U.S. Cl.
CPC .......... *H05K 3/32* (2013.01); *B60R 16/0238* (2013.01); *H01R 13/502* (2013.01); *H01R 13/6215* (2013.01); *H05K 2201/10962* (2013.01)

(58) Field of Classification Search
USPC ...................... 439/364, 76.2, 680
See application file for complete search history.

(56) References Cited

U.S. PATENT DOCUMENTS

| 4,627,759 | A | * | 12/1986 | Kato | ................ | H01R 13/6215 403/13 |
| 5,730,617 | A | * | 3/1998 | Araki | ................ | B60R 16/0239 439/374 |
| 6,126,458 | A | | 10/2000 | Gregory et al. | | |
| 7,931,479 | B1 | * | 4/2011 | De La Reza | ....... | B60R 16/0238 439/76.2 |
| 8,027,168 | B2 | * | 9/2011 | Senk | ................ | B60R 16/0238 174/387 |
| 8,545,153 | B2 | * | 10/2013 | Smith | ................ | F16B 31/02 411/107 |

* cited by examiner

*Primary Examiner* — Tho D Ta
(74) *Attorney, Agent, or Firm* — Robert J. Myers

(57) ABSTRACT

A bussed electrical center includes an electrical-assembly and a single fastening feature. The electrical-assembly includes a lower-housing, a printed-circuit-board, an upper-housing, and electrical-devices. The lower-housing engages an outer-housing that retains electrical-connectors having a plurality of electrical-terminals. The printed-circuit-board has a plurality of corresponding-electrical-terminals configured to mate with the plurality of electrical-terminals of the electrical-connectors. The electrical-assembly defines a guide-hole that passes through the upper-housing, the printed-circuit-board, and the lower-housing, wherein the guide-hole defines a shoulder in the upper-housing. The single fastening feature consists of one first-fastener element positioned within the guide-hole that has a flange and a shank. The shank is operable to engage one second-fastener element in the outer-housing. The flange engages the shoulder, wherein the electrical-assembly is drawn into the outer-housing when the first-fastener element and the second-fastener element are tightened together to mate the electrical-terminals with the corresponding-electrical-terminals.

8 Claims, 5 Drawing Sheets

US 10,028,391 B1

BUSSED ELECTRICAL CENTER

TECHNICAL FIELD OF INVENTION

This disclosure generally relates to a bussed electrical center, and more particularly relates to a bussed electrical center secured solely by a single fastening feature.

BACKGROUND OF INVENTION

It is known to install a bussed electrical center in a vehicle using multiple fasteners. The typical bussed electrical center includes multiple, separate, electrical connectors that engage terminals on a printed circuit board to distribute electrical power to various circuits in a vehicle wiring harness. Each of the separate electrical connectors typically use a separate fastener to maintain the interconnection between the electrical connector and the corresponding terminals on the printed circuit board. The bussed electrical is typically secured to a housing that is preinstalled on the vehicle using another, separate, primary, fastener that does not contribute to the interconnections between the electrical connector and the electrical terminals.

FIG. 1 is an exploded view of an illustration of a prior art bussed electrical center 100. Three electrical connectors 124 illustrated in FIG. 1 are mated with corresponding electrical terminals located on a printed circuit board using three, separate, connector-fasteners 111 that engage captured nuts (not shown) located in the electrical connectors 124. A torque applied to the connector-fasteners 111 draws the electrical connectors 124 toward the printed circuit board until the electrical connectors 124 are mated with the corresponding electrical terminals on the printed circuit board. A separate fastener (not shown) is used to secure the bussed electrical center 100 to an outer housing, or splash shield, that is mounted to a vehicle.

SUMMARY OF THE INVENTION

In accordance with one embodiment, a bussed electrical center is provided. The bussed electrical center includes an electrical-assembly and a single fastening feature. The electrical-assembly includes a lower-housing, a printed-circuit-board, an upper-housing, and electrical-devices. The lower-housing slideably engages an outer-housing that retains a plurality of electrical-connectors having a plurality of electrical-terminals. The printed-circuit-board is interposed between and enclosed within the upper-housing and the lower-housing. The printed-circuit-board has a plurality of corresponding-electrical-terminals configured to mate with the plurality of electrical-terminals of the plurality of electrical-connectors. The corresponding-electrical-terminals project beyond the lower-housing. The upper-housing is removably attached to the lower-housing. The electrical-assembly defines a guide-hole that passes through the upper-housing, the printed-circuit-board, and the lower-housing. The guide-hole defines a shoulder in the upper-housing. The single fastening feature consists of one first-fastener element positioned within the guide-hole. The first-fastener element has a flange and a shank. The shank is operable to engage one second-fastener element disposed within the outer-housing. The flange engages the shoulder, wherein the electrical-assembly is drawn into the outer-housing when the first-fastener element and the second-fastener element are tightened together, whereby the plurality of electrical-terminals are mated with the plurality of corresponding-electrical-terminals. The outer-housing and the electrical-assembly are secured to each other solely by the single fastening feature.

The lower-housing includes alignment-towers and the plurality of electrical-connectors include alignment-holes. The alignment-towers slideably engage the alignment-holes prior to engagement of the lower-housing with the outer-housing.

The outer-housing further includes a perimeter-channel and the lower-housing further includes a perimeter-skirt. The perimeter-channel inhibits tilting of the lower-housing when the electrical-assembly is drawn into the outer-housing.

The plurality of electrical-connectors further include a plurality of cavities in which the plurality of electrical-terminals are retained. The plurality of corresponding-electrical-terminals of the printed-circuit-board are partially disposed within the plurality of cavities when the lower-housing is in a pre-stage position.

Insertion-forces required to mate the plurality of electrical-terminals with the plurality of corresponding-electrical-terminals are evenly distributed across the lower-housing.

The shank of the first-fastener element defines a helical-threaded-portion and the second-fastener element defines a corresponding-helical-threaded-portion.

A torque of about 7.5 Newton-meters to about 10.5 Newton-meters (N-m), preferably 9 N-m, is applied to the first-fastener to secure the outer-housing to the electrical-assembly.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which.

DETAILED DESCRIPTION

Figure 1:
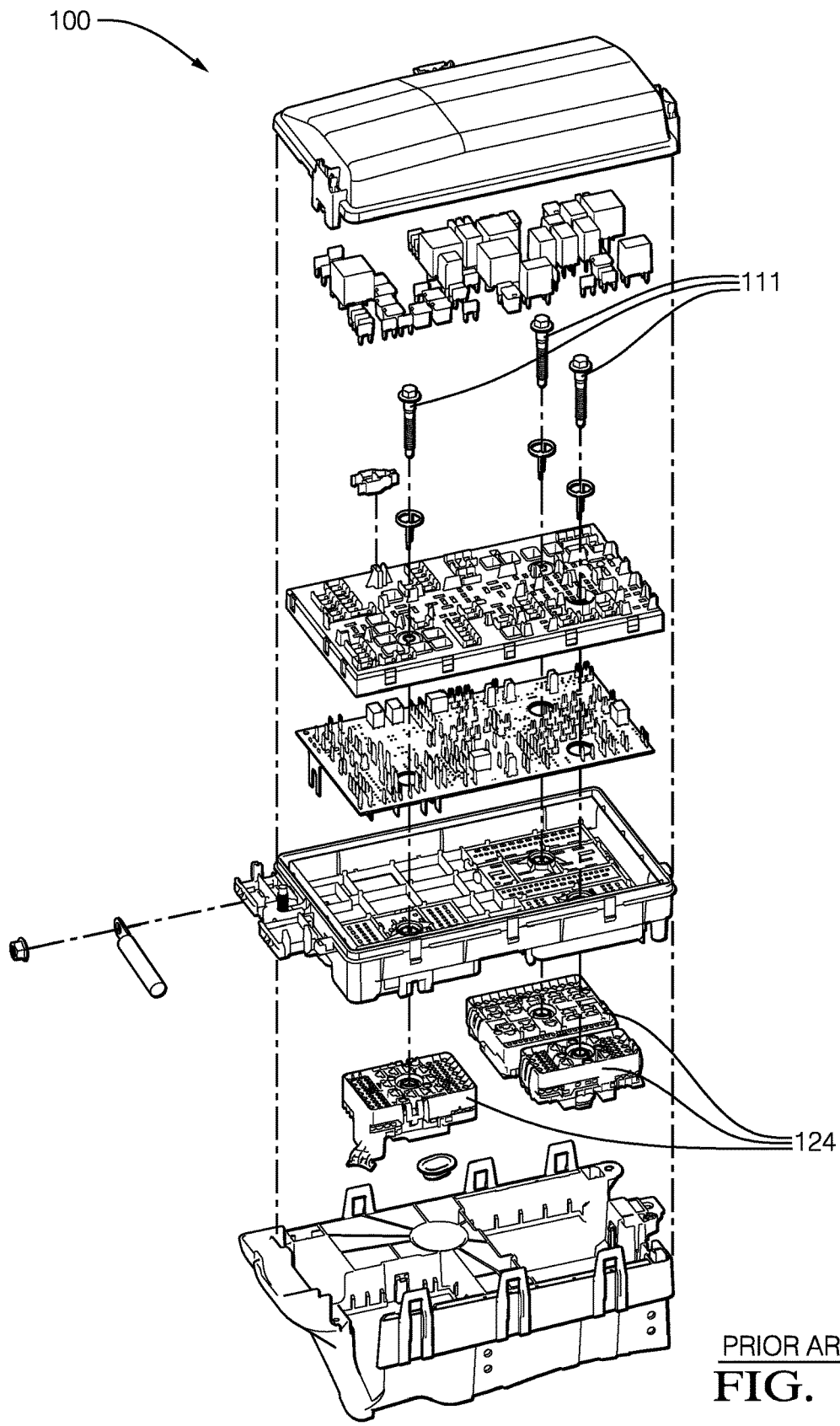
FIG. 1 is an exploded view of a bussed electrical center having separate connector-fasteners for each electrical-connector according to the prior art.
Figure 2:
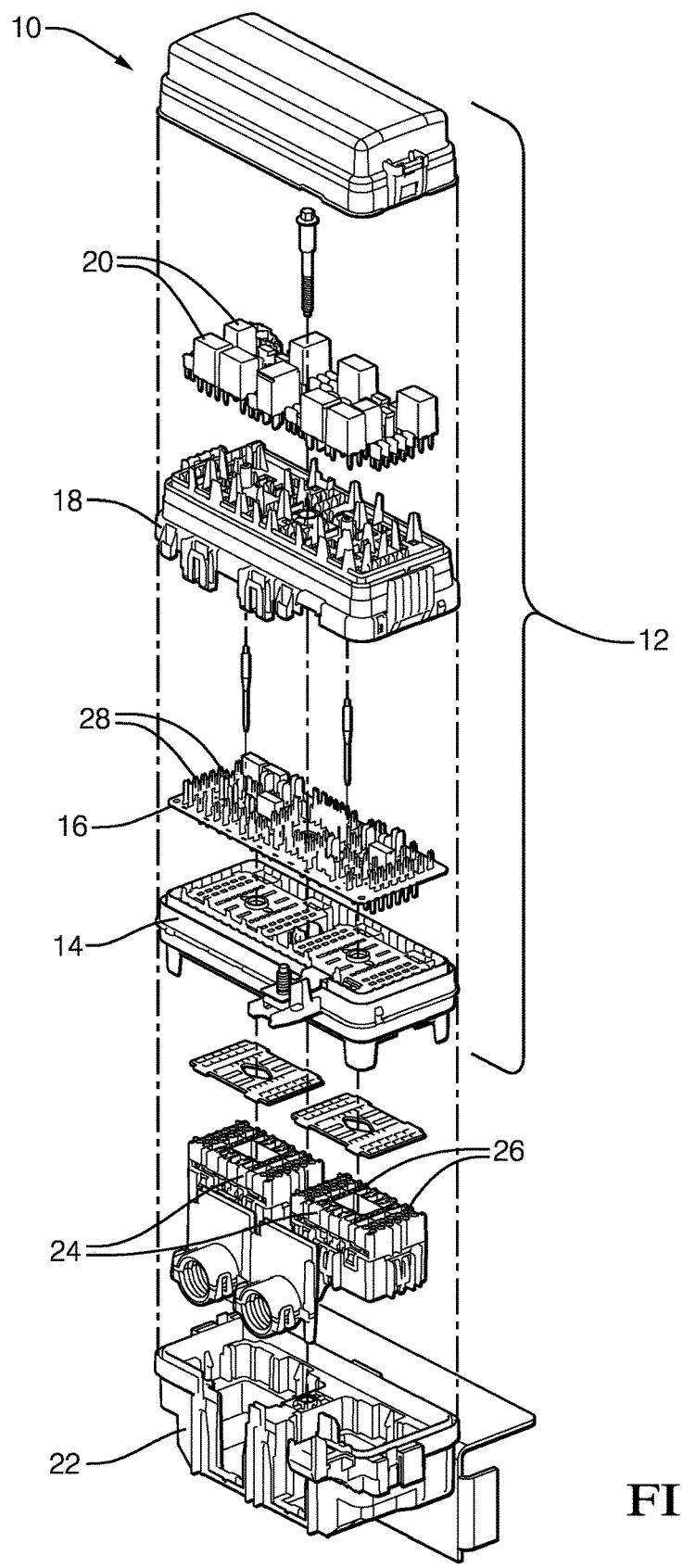
FIG. 2 is an exploded view of a bussed electrical center and outer housing in accordance with one embodiment.

FIG. 2 illustrates a non-limiting example of an exploded view of a bussed electrical center 10, hereafter referred to as a BEC 10. The BEC 10 is used to distribute electrical-power and electrical-signals throughout the vehicle. The BEC 10 may include a lug (not shown) that connects to a battery (+) terminal that allows a user to access to the battery for jump-starting the vehicle.

The BEC 10 includes an electrical-assembly 12 that includes a lower-housing 14, a printed-circuit-board 16 (PCB 16), an upper-housing 18, and electrical-devices 20.

Figure 3:
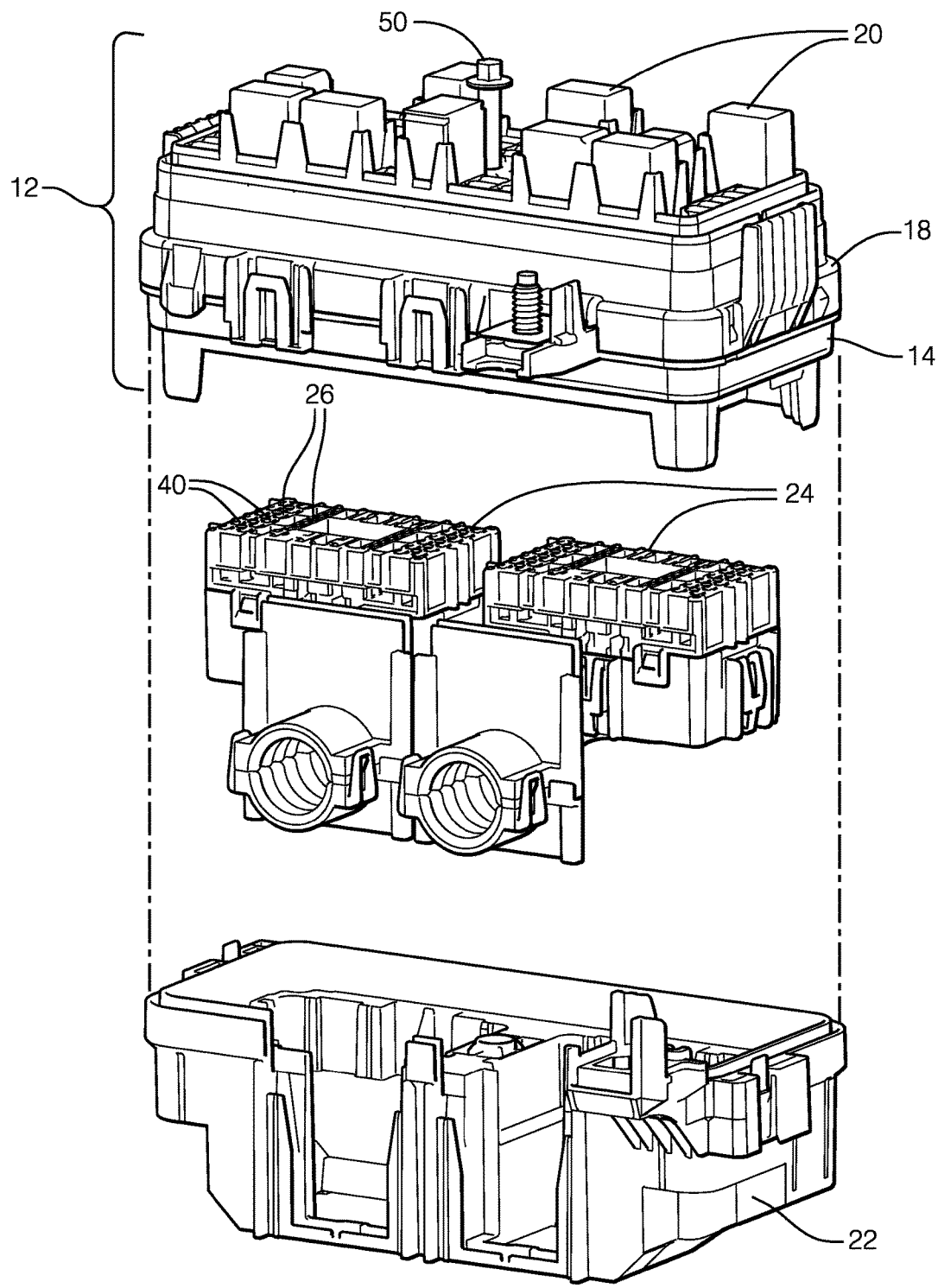
FIG. 3 is an exploded view of the bussed electrical center of FIG. 2 with an electrical-assembly as a subassembly in accordance with one embodiment.

The electrical-assembly 12 may be a sub-assembly that is pre-assembled and delivered to a vehicle assembly plant for installation onto a vehicle, as illustrated in FIG. 3. A cover may be removably attached to the upper-housing 18 after the electrical-assembly 12 is installed to protect the electrical-devices 20 from contamination and moisture. The electrical-devices 20 may include, but are not limited to, fuses and/or switching devices, such as relays.

Figure 4:
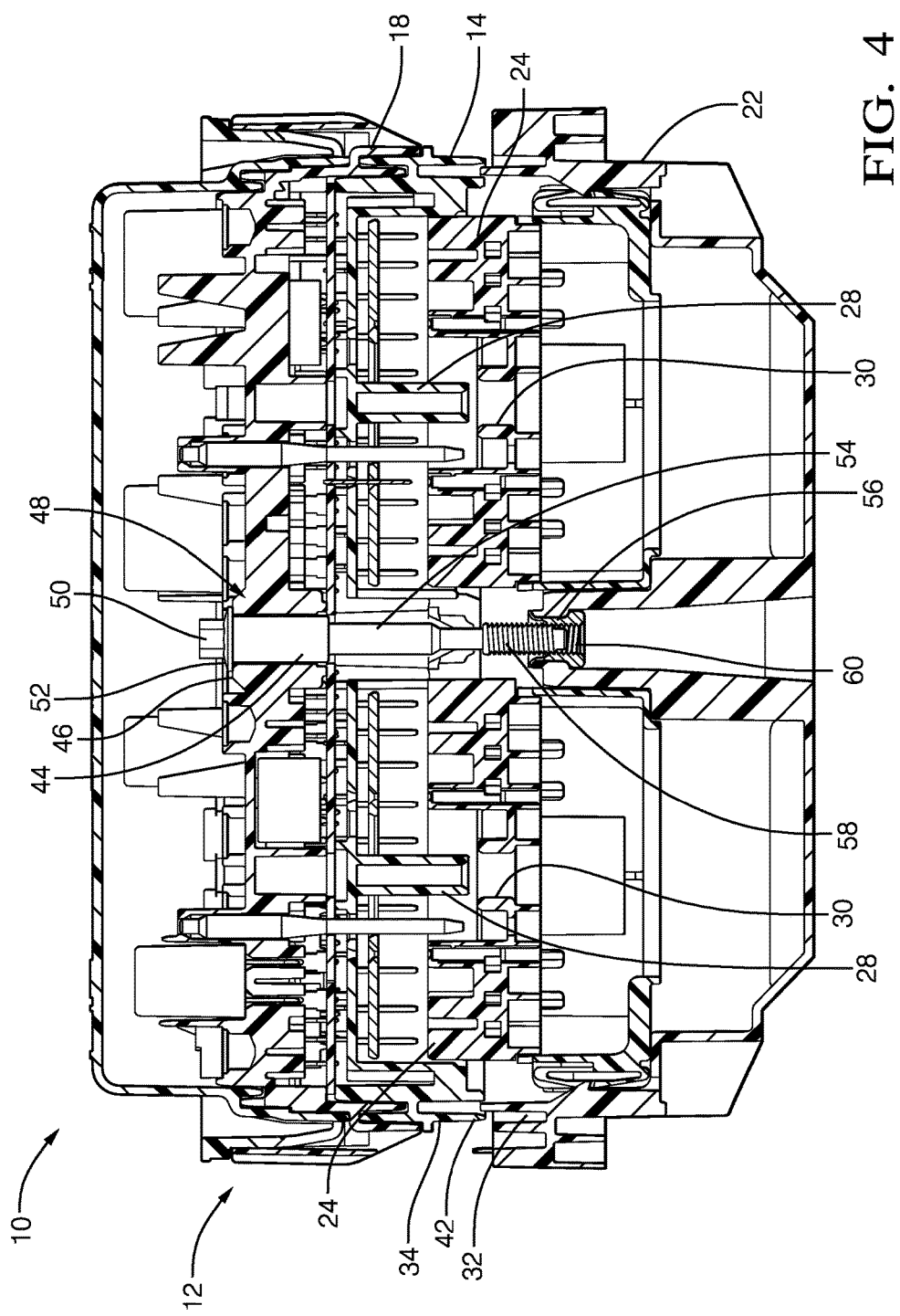
FIG. 4 is a section view of the bussed electrical center of FIG. 2 in a pre-stage position in accordance with one embodiment.

FIGS. 3-4 illustrate the electrical-assembly 12 assembled into the sub-assembly. The lower-housing 14 slideably engages an outer-housing 22 that retains a plurality of electrical-connectors 24 having a plurality of electrical-terminals 26 (not shown in FIGS. 3 and 4). The lower-housing 14 may be fabricated from a polymeric material, such as a polyamide, or other electrically insulating material. The lower-housing 14 may include alignment-towers 28 and the plurality of electrical-connectors 24 may include alignment-holes 30 (see FIG. 4). The alignment-towers 28 slideably engage the alignment-holes 30 prior to engagement of the lower-housing 14 with the outer-housing 22. The alignment-holes 30 are preferably centrally located in the electrical-connectors 24. The plurality of electrical-connectors 24 are typically attached to a wiring-harness (not shown) that distributes the electrical-power and the electrical-signals throughout the vehicle.

The outer-housing 22 is typically mounted within an engine compartment of a vehicle (not shown) where the BEC 10 may be accessed for service. The outer-housing 22 may be fabricated from a polymeric material, such as a polyamide, or other electrically insulating material. As illustrated in FIG. 4, the outer-housing 22 may include a perimeter-channel 32 and the lower-housing 14 may include a perimeter-skirt 34. The perimeter-channel 32 inhibits a tilting (not shown) of the lower-housing 14 when the electrical-assembly 12 is drawn into the outer-housing 22.

The PCB 16 (see FIG. 2) is interposed between and enclosed within the upper-housing 18 and the lower-housing 14, and has a plurality of corresponding-electrical-terminals 38 configured to mate with the plurality of electrical-terminals 26 of the plurality of electrical-connectors 24. The corresponding-electrical-terminals 38 on the PCB 16 project beyond the lower-housing 14 for a distance sufficient to engage the plurality of electrical-terminals 26. The plurality of electrical-connectors 24 may include a plurality of cavities 40 (see FIG. 3) in which the plurality of electrical-terminals 26 are retained. The plurality of corresponding-electrical-terminals 38 of the PCB 16 may be partially disposed within the plurality of cavities 40 when the lower-housing 14 is in a pre-stage position 42, as illustrated in FIG. 4. The PCB 16 may be formed of circuit board substrates that are made of epoxy-resins or polyimide-resins. The resin may be reinforced with a woven glass cloth or other matrix such as chopped fibers. Substrates formed of such materials are typically referred to as FR-4 or G-10 type circuit boards. The circuit board substrate may alternatively be constructed of ceramic or rigid polymer materials. This listing of acceptable substrate materials is not exhaustive and other materials may also be used successfully. The PCB 16 may also include various electronic-components (not specifically shown) including, but not limited to, capacitors, resistors, inductors, amplifiers, micro-processors, etc. as will be recognized by one skilled in the art.

The upper-housing 18 is removably attached to the lower-housing 14 by a series of locking tabs and corresponding locking-ramps distributed about a perimeter of the upper-housing 18. The upper-housing 18 may be fabricated from a polymeric material, such as a polyamide, or other electrically insulating material.

The electrical-assembly 12 defines a guide-hole 44 (see FIG. 4) that passes through the upper-housing 18, the PCB 16, and the lower-housing 14, and is preferably centrally located in the electrical-assembly 12. The guide-hole 44 defines a shoulder 46 in the upper-housing 18 that is a primary bearing-surface, as will be described in more detail below.

The BEC 10 also includes a single fastening feature 48 (see FIG. 4) consisting of one first-fastener element 50 positioned within the guide-hole 44. In this particular example the one first-fastener element 50 is one bolt 50 that has a flange 52 and a shank 54. The shank 54 is operable to engage one second-fastener element 56 disposed within the outer-housing 22. The shank 54 of the first-fastener element 50 may define a helical-threaded-portion 58 and the second-fastener element 56 may define a corresponding-helical-threaded-portion 60. In this particular example the second-fastener element 56 is a captured-nut 56 that is molded into the outer-housing 22. In alternative embodiments the second-fastener element 56 may be a threaded sleeve that is installed after the outer-housing 22 is fabricated.

Figure 5:
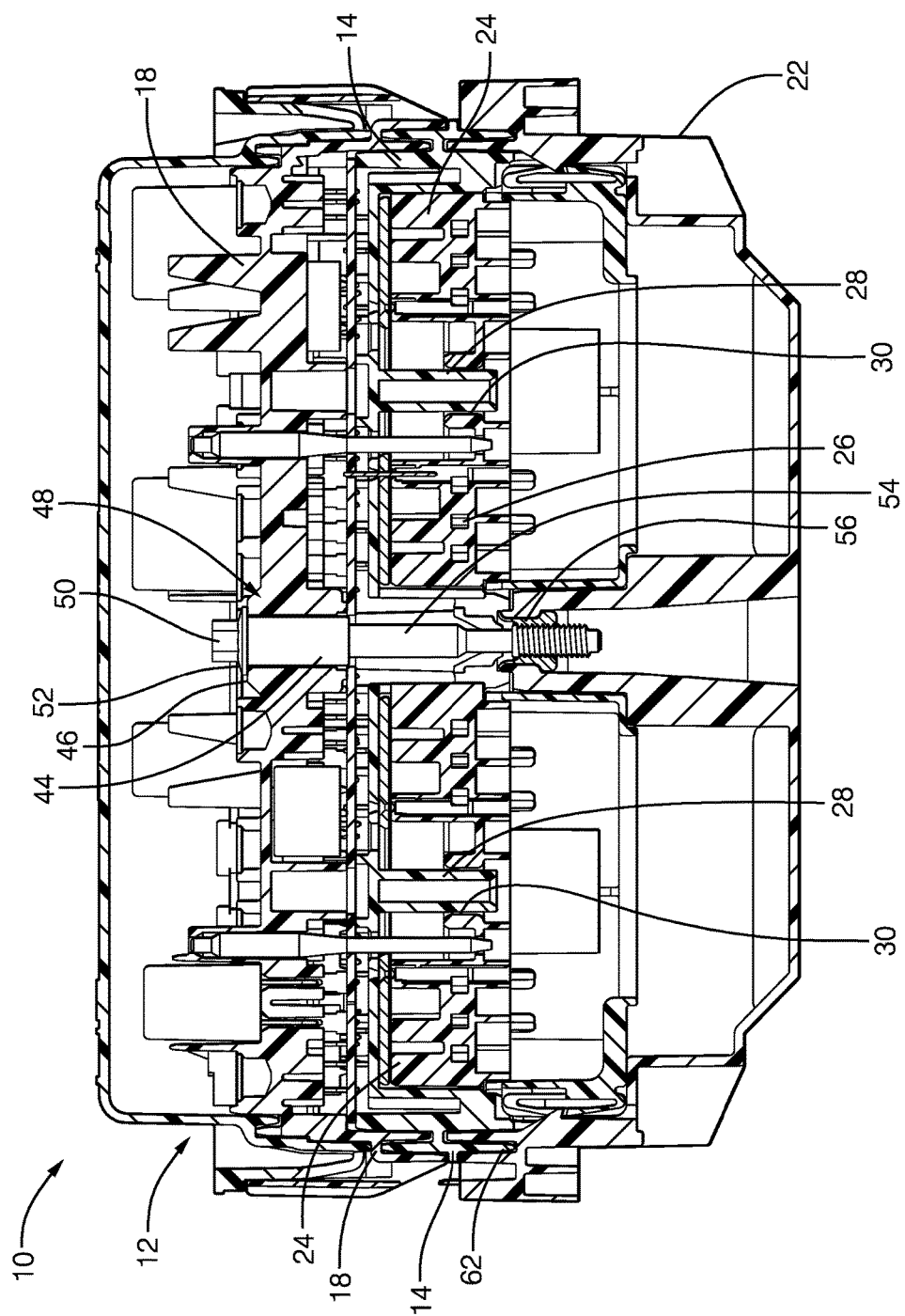
FIG. 5 is a section view of the bussed electrical center of FIG. 4 in an installed-position in accordance with one embodiment.

FIG. 5 illustrates a section view of the BEC 10 with the electrical-assembly 12 in an installed-position 62. The flange 52 of the one bolt 50 engages the shoulder 46 of the upper-housing 18 such that the electrical-assembly 12 is drawn into the outer-housing 22 when the one bolt 50 and the captured-nut 56 are tightened together. The plurality of electrical-terminals 26 are then mated with the plurality of corresponding-electrical-terminals 38, and the outer-housing 22 and the electrical-assembly 12 are secured to each other solely by the single fastening feature 48. Preferably, insertion-forces (not shown) required to mate the plurality of electrical-terminals 26 with the plurality of corresponding-electrical-terminals 38 are evenly distributed across the lower-housing 14. The even distribution of the insertion-forces may be enabled by balancing a number of male-electrical-terminals (not shown) with a number of female-electrical-terminals (not shown) in the BEC 10, and/or may be enabled by balancing the total number of electrical-connectors 24 in the BEC 10.

The electrical-assembly 12 may be secured to the outer-housing 22 by the application of a torque to the first-fastener element 50 in a range from about 7.5 Newton-meters to about 10.5 Newton-meters, and preferably with the torque of 9 Newton-meters.

Accordingly, a bussed electrical center 10 is provided. The bussed electrical center 10 is an improvement over other bussed electrical centers because it uses the single fastening feature 48 to both interconnect the electrical-connectors 24, and to mount the bussed electrical center 10 to the vehicle.

While this invention has been described in terms of the preferred embodiments thereof, it is not intended to be so limited, but rather only to the extent set forth in the claims that follow.

We claim:

1. A bussed electrical center comprising:
an electrical-assembly that includes a lower-housing, a printed-circuit-board, an upper-housing, and electrical-devices, wherein the lower-housing slideably engages an outer-housing that retains a plurality of electrical-connectors having a plurality of electrical-terminals, said printed-circuit-board interposed between and enclosed within the upper-housing and the lower-housing, said printed-circuit-board having a plurality of corresponding-electrical-terminals configured to mate with the plurality of electrical-terminals of the plurality of electrical-connectors, said corresponding-electrical-terminals projecting beyond the lower-housing, said upper-housing removably attached to the lower-housing, said electrical-assembly defines a guide-hole that passes through the upper-housing, the printed-circuit-board, and the lower-housing, said guide-hole defines a shoulder in the upper-housing; and a single fastening feature consisting of one first-fastener element positioned within the guide-hole, said first-fastener element having a flange and a shank, said shank operable to engage one second-fastener element disposed within the outer-housing, said flange engages the shoulder, wherein the electrical-assembly is drawn into the outer-housing when the first-fastener element and the second-fastener element are tightened together, whereby the plurality of electrical-terminals are mated with the plurality of corresponding-electrical-terminals, wherein the outer-housing and the electrical-assembly are secured to each other solely by the single fastening feature.

2. The bussed electrical center in accordance with claim 1, wherein the lower-housing includes alignment-towers and the plurality of electrical-connectors include alignment-holes, wherein said alignment-towers slideably engage the alignment-holes prior to engagement of the lower-housing with the outer-housing.

3. The bussed electrical center in accordance with claim 1, wherein the outer-housing further includes a perimeter-channel and the lower-housing further includes a perimeter-skirt, wherein the perimeter-channel inhibits tilting of the lower-housing when the electrical-assembly is drawn into the outer-housing.

4. The bussed electrical center in accordance with claim 1, wherein the plurality of electrical-connectors further include a plurality of cavities in which the plurality of electrical-terminals are retained, and wherein the plurality of corresponding-electrical-terminals of the printed-circuit-board are partially disposed within the plurality of cavities when the lower-housing is in a pre-stage position.

5. The bussed electrical center in accordance with claim 1, wherein insertion-forces required to mate the plurality of electrical-terminals with the plurality of corresponding-electrical-terminals are evenly distributed across the lower-housing.

6. The bussed electrical center in accordance with claim 1, wherein the shank of the first-fastener element defines a helical-threaded-portion and wherein the second-fastener element defines a corresponding-helical-threaded-portion.

7. The bussed electrical center in accordance with claim 6, wherein the first-fastener element is characterized as having a torque of about 7.5 Newton-meters to about 10.5 Newton-meters when the outer-housing is secured to the electrical-assembly.

8. The bussed electrical center in accordance with claim 7, wherein the first-fastener element is characterized as having a torque of 9 Newton-meters when the outer-housing is secured to the electrical-assembly.

* * * * *